United States Patent
Noma et al.

(10) Patent No.: US 6,320,301 B1
(45) Date of Patent: Nov. 20, 2001

(54) PIEZOELECTRIC-TRANSFORMER INVERTER

(75) Inventors: Takashi Noma, Moriyama; Ken Takakura, Kusatsu; Yasuyuki Morishima, Kyotanabe, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/291,730

(22) Filed: Apr. 14, 1999

(30) Foreign Application Priority Data

Apr. 16, 1998 (JP) .................................................. 10-124118

(51) Int. Cl.⁷ .................................................. H01L 41/04
(52) U.S. Cl. ............................................ 310/359; 310/318
(58) Field of Search .................................. 310/359, 365, 310/366, 317, 318

(56) References Cited

U.S. PATENT DOCUMENTS

| | | | | |
|---|---|---|---|---|
| 5,118,982 | * | 6/1992 | Inoue et al. | 310/366 |
| 5,705,877 | * | 1/1998 | Shimada | 310/318 |
| 5,705,879 | * | 1/1998 | Abe et al. | 310/359 |
| 5,859,489 | * | 1/1999 | Shimada | 310/318 |
| 5,872,419 | * | 2/1999 | Hall et al. | 310/359 |
| 5,894,184 | * | 4/1999 | Furuhashi et al. | 310/316.01 |
| 6,013,969 | * | 1/2000 | Noma et al. | 310/318 |

FOREIGN PATENT DOCUMENTS

| | | |
|---|---|---|
| 9-56175 | 2/1997 | (JP) . |
| 9-74236 | 3/1997 | (JP) . |
| 9107684 | 4/1997 | (JP) . |

* cited by examiner

Primary Examiner—Nestor Ramirez
Assistant Examiner—Peter Medley
(74) Attorney, Agent, or Firm—Ostrolenk, Faber, Gerb & Soffen, LLP

(57) ABSTRACT

A piezoelectric-transformer inverter includes a piezoelectric transformer for supplying a transformed voltage to a load connected to a secondary electrode thereof. A first coil and a first transistor are connected to one primary electrode of the piezoelectric transformer, and a second coil and a second transistor are connected to the other primary electrode of the piezoelectric transformer. The first and second transistors are alternately turned on and off such that the phase of the voltage applied between the primary electrodes is reversed cyclically. The operation frequency is controlled such that an AC current flowing through the load is maintained at a predetermined level. The piezoelectric transformer has a piezoelectric substrate. In a first half region of the piezoelectric substrate, a plurality of electrode films are layered in order to form the primary electrodes. The secondary electrode is formed on an end surface of the piezoelectric substrate opposite to the primary electrodes. The piezoelectric substrate is polarized in a first direction in the first half region where the primary electrodes exist and is polarized in a second direction different from the first direction in a second half region where the secondary electrode exists. The piezoelectric transformer operates in a half wavelength mode.

5 Claims, 14 Drawing Sheets

PIEZOELECTRIC-TRANSFORMER INVERTER

BACKGROUND OF THE INVENTION

1. Field of the Invention

The present invention relates to a piezoelectric-transformer inverter for converting DC voltage to AC voltage through use of a piezoelectric transformer.

2. Description of the Related Art

Recently, back lit liquid crystal displays have come into general use as display units for portable information processing apparatus such as laptop personal computers. A fluorescent tube, such as a cold-cathode tube, is used as a light source of such a back light. In order to light the fluorescent tube, a high AC voltage must be applied thereto. Because a battery and an AC adapter are generally used as an input power source of the portable information processing apparatus such as a laptop personal computer, a DC/AC inverter must be used to convert a low DC voltage supplied from the input power source to an AC voltage that is sufficiently high to power the fluorescent tube.

Recently, there has been developed a piezoelectric-transformer inverter which uses a piezoelectric transformer that is smaller than an electromagnetic transformer. In order to use such transformer to convert power for the fluorescent tube, a piezoelectric transformer is sometimes required to meet the following requirements:

(1) it must be operable at a low voltage; specifically, that output by one lithium-ion cell; and (2) it must be small and thin.

In relation to Requirement (1): In general, a voltage of 700 V (peak-to-peak voltage) or higher is needed in a steady state to light a fluorescent tube such as a cold-cathode tube, although the specific value depends on the length of the fluorescent tube. However, the voltage of one lithium-ion cell is only about 2.5 to 4 V. To compensate for this difference, the inverter must provide a step-up ratio within the range of 175 (=700/4) to 300 (=700/2.5). Since the luminance efficiency (luminance/power consumption of the cold cathode tube) of the cold cathode tube, including peripheral panel parts, is considered to be highest at a frequency of about 50 to 100 kHz, the drive frequency must generally fall within the range of 50 to 100 kHz.

In relation to Requirement (2): A Rosen-type piezoelectric transformer, which is a basic piezoelectric transformer, will be described with reference to FIG. 1. In a Rosen-type piezoelectric transformer 1, primary electrodes 3 are formed in one half of a piezoelectric substrate 2, formed of piezoelectric ceramics. The primary electrodes 3 are formed in the longitudinal direction, on top and bottom main faces of the piezoelectric substrate 2. The piezoelectric substrate 2 is polarized in a direction perpendicular to the surfaces of primary electrodes 3 (in the thicknesswise direction of the piezoelectric substrate 2) in this area. In the other half of the piezoelectric substrate, the piezoelectric substrate 2 is polarized in the longitudinal direction, and a secondary electrode 4 is formed on an end surface adjacent to the second half region. The directions of polarization of the piezoelectric substrate 2 are shown by arrows P (arrows P are also used to indicate directions of polarization in the drawings relating to the description that follows). In the Rosen-type piezoelectric transformer 1, when an AC voltage output from an input power source 6 is applied to the primary electrodes 3 which face each other with the piezoelectric substrate 2 disposed therebetween the applied voltage is converted to a mechanical distortion. This distortion excites a mechanical vibration in the longitudinal direction of the Rosen-type piezoelectric transformer 1, and the mechanical vibration is then converted to an electrical vibration. Thus, a transformer function is realized, so that a stepped-up voltage is applied to a fluorescent tube 5 serving as a load.

FIG. 2 shows possible vibration modes in the longitudinal direction of the Rosen-type piezoelectric transformer 1. Since the opposite ends of the piezoelectric transformer 1 are open ended as shown in (a), the piezoelectric transformer 1 can vibrate in a $\lambda/2$ (half wavelength) mode, a $\lambda$ mode, or a $3\lambda/2$ mode, which are shown at (b), (c) and (d), respectively, of FIG. 2 and vibrates at a lowest frequency in the $\lambda/2$ mode. When the vibration frequency of the $\lambda/2$ mode is represented by fo, the vibration frequencies of the $\lambda$ mode and the $3\lambda/2$ mode are represented by 2fo and 3fo, respectively. In the $\lambda/2$ mode, the $\lambda$ mode, and the $3\lambda/2$ mode, the length L of the piezoelectric transformer 1 and the wavelength $\lambda$ satisfy the equations $L=\lambda/2$, $L=\lambda$, and $L=3\lambda/2$, respectively. In other words, when the piezoelectric transformer is driven at a specific frequency (for example, in the frequency range of 50 to 100 kHz), the size of the piezoelectric transformer can be advantageously decreased through employment of the $\lambda/2$ mode.

However, in practice, $\lambda$-mode piezoelectric transformers have conventionally been used more often than have $\lambda/2$-mode piezoelectric transformers, because $\lambda/2$-mode piezoelectric transformers have the following drawbacks. First, the step-up ratios (=output voltage/input voltage) of $\lambda/2$-mode piezoelectric transformers are generally lower than those of $\lambda$-mode piezoelectric transformers. In addition, when voltage input to a piezoelectric transformer is not sinusoidal, a $\lambda$-mode vibration is also generated as a harmonic of a $\lambda/2$-mode vibration. As a result, distortion of the output voltage or current increases. In general, in a piezoelectric-transformer inverter used for a back light of a liquid crystal display, current flowing through the fluorescent tube is monitored, and frequency control is performed in order to maintain the peak value of the monitored current at a constant level. However, when the distortion of waveform is large, the root-mean-square value of the current changes even if the peak value of the current is maintained constant. Therefore, the current-controlling performance is poor.

First Conventional Example

In order to solve the above-described problems and to meet the requirements of piezoelectric-transformer inverters, various improved piezoelectric-transformer inverters and improved piezoelectric transformers have been proposed, as disclosed in, for example, Japanese Patent Application Laid-Open Nos. 9-107684, 9-56175, and 9-74236. FIG. 3 shows a piezoelectric-transformer inverter disclosed in Japanese Patent Application Laid-Open No. 9-107684. This piezoelectric-transformer inverter 11 is formed of a piezoelectric transformer 13, a frequency control circuit 14, a step-up circuit (drive circuit) 15, a drive voltage control circuit 16, and a light adjustment circuit 17. The piezoelectric transformer 13 applies a voltage to a fluorescent tube 12. The frequency control circuit 14 detects current that is supplied from the secondary electrode of the piezoelectric transformer 13 to the fluorescent tube 12, and controls the drive frequency of the piezoelectric transformer 13 in order to maintain the detected current at a predetermined level. The step-up circuit 15 divides the drive frequency, generates a drive voltage having a divided frequency, and supplies the generated drive voltage to the primary electrodes of the piezoelectric transformer 13. The drive voltage control circuit 16 controls the drive voltage such that the drive voltage applied to the piezoelectric transformer 13 is maintained at a predetermined constant level even when the input power source voltage $V_{DD}$ changes. The light adjustment circuit 17 controls averaged load current (tube current) flowing through the fluorescent tube 12, by means of PWM control.

In the piezoelectric-transformer inverter 11 as well, the drive frequency is controlled by the frequency control circuit 14 and the like such that the output current is maintained constant. The step-up circuit 15 is constructed such that push-pull operation (quasi-E-class operation) is realized through use of two transistors 18 and 19 as well as two coils 20 and 21. In the piezoelectric-transformer inverter 11 of such a push-pull operation, as a result of on/off operation of the two transistors 18 and 19 of the step-up circuit 15, a drive voltage applied between the primary electrodes of the piezoelectric transformer 13 has a waveform similar to a sinusoidal waveform, and is amplified to a high voltage.

Further, since the drive voltage control circuit 16 is provided in a stage preceding the step-up circuit 15 in order to adjust the average voltage applied to the step-up circuit 15, the piezoelectric-transformer inverter 11 can cope with a wide range of input voltage. Moreover, since the drive voltage control circuit 16 is operated and stopped intermittently by the light adjustment circuit 17, the output current can be adjusted within a wide range.

In the piezoelectric-transformer inverter 11, since push-pull operation is effected through use of the two transistors 18 and 19 and the two coils 20 and 21, the voltage input to the piezoelectric transformer can be doubled, so that an insufficient step-up ratio of the piezoelectric transformer can be supplemented. However, by itself, the employment of push-pull operation is insufficient for obtaining a required step-up ratio of about 300 times.

Second Conventional Example

FIG. 4 shows a piezoelectric-transformer inverter disclosed in Japanese Patent Application Laid-Open No. 9-56175. This piezoelectric-transformer inverter 31 utilizes an electromagnetic step-up transformer 32. DC voltage supplied from an input power source 35 is converted to AC voltage by means of a tank circuit composed of a capacitor 34 and a primary coil 33 of the electromagnetic step-up transformer 32. The voltage generated in the primary coil 33 is stepped up in order to extract a stepped up voltage from a secondary coil 36 of the electromagnetic step-up transformer 32. The voltage output from the secondary coil 36 is applied between primary electrodes 38 of a piezoelectric transformer 37, so that a further stepped up voltage is output from a secondary electrode 39 of the piezoelectric transformer 37 and is applied to a fluorescent tube 40. Thus, a load current is supplied to the fluorescent tube 40.

However, since the electromagnetic step-up transformer 32 is generally larger in size than coils (inductors), the piezoelectric-transformer inverter 31 utilizing the electromagnetic step-up transformer 32 is not suitable for miniaturization. Further, in the piezoelectric-transformer inverter 31, vibration occurs in the λ mode due to harmonics of the voltage input to the piezoelectric transformer 37, so that the voltage output from the piezoelectric transformer 37 is distorted.

Third Conventional Example

FIG. 5 shows a piezoelectric transformer disclosed in Japanese Patent Application Laid-Open No. 9-74236. This piezoelectric transformer 41 is of a center drive type. Primary electrodes 43 are formed on the top and reverse main faces of the piezoelectric substrate 42 to be located at the central portion thereof. Secondary electrodes 44 are formed on the longitudinally opposite end surfaces of the piezoelectric substrate 42 in order to form electricity generation sections in the longitudinally opposite end portions. In the piezoelectric transformer 41, the piezoelectric substrate 42 is polarized such that the portion thereof at the drive section is polarized in the direction perpendicular to the primary electrodes 43 while two remaining portions at the generation sections are polarized oppositely in the direction parallel to the primary electrodes 43. In this structure, since the two portions at the generation sections are polarized in opposite directions, the piezoelectric transformer 41 has a symmetric structure along the longitudinal direction with respect to the center thereof. Therefore, the charge generated in the piezoelectric substrate 42 is effectively canceled in the λ-mode vibration, thereby suppressing the harmonic components of the output voltage.

However, since the piezoelectric transformer 41 is of a center drive type, the opposite ends (secondary electrodes 44) become high voltage ends, so that other components cannot be mounted in the vicinity of the ends. By contrast, in the case of a Rosen-type piezoelectric transformer, since high voltage appears at only one end of the transformer, other components can be mounted in the vicinity of the low-voltage-side (primary-electrode side). Therefore, the piezoelectric-transformer inverter utilizing the center-drive-type piezoelectric transformer 41 has a drawback in that, compared to the case of a piezoelectric-transformer inverter utilizing a Rosen-type piezoelectric transformer, its dead space increases and thus its installation area increases.

SUMMARY OF THE INVENTION

In view of the foregoing, an object of the present invention is to provide a compact piezoelectric-transformer inverter which can increase the step-up ratio of a piezoelectric transformer and which does not cause distortion of output waveform, unlike the case where a conventional Rosen-type piezoelectric transformer is used.

A piezoelectric-transformer inverter according to the present invention comprises a piezoelectric transformer operating to transform an AC voltage applied between its primary electrodes to a transformed voltage supplied to a load connected to its secondary electrode, said piezoelectric transformer comprising: a piezoelectric substrate having a first region which is polarized in a first direction and a second region which is polarized in a second direction different than said first direction; a plurality of electrode films layered in said first region and connected together into first and second groups to form said first and second primary electrodes; and an electrode formed on an end surface of said piezoelectric substrate located substantially adjacent said second region to form said secondary electrode; a first coil and a first switching element connected to said first primary electrode of said piezoelectric transformer; a second coil and a second switching element connected to said second primary electrode of said piezoelectric transformer; a drive circuit which alternately drives said first and second switching elements such that the phase of the voltage applied between said primary electrodes is reversed cyclically; and drive frequency control circuit which controls an AC current flowing through said load at a predetermined value by changing the operation frequency of said drive circuit; said piezoelectric transformer operating in a half wavelength mode.

Preferably, the piezoelectric transformer is a Rosen-type piezoelectric-transformer in which the primary electrodes have a layered structure.

In the present invention, since the primary electrodes of the piezoelectric transformer have a layered structure, the step-up ratio of the piezoelectric transformer can be increased, so that the piezoelectric transformer can output a voltage much higher than that of an input power source. Therefore, a fluorescent tube or a like load can be driven through use of a low voltage power source such as a single lithium-ion cell. Furthermore, a Rosen-type piezoelectric transformer or a similar piezoelectric transformer is used, with the result that the dead space of the piezoelectric-transformer inverter can be decreased in order to reduce the size of the piezoelectric-transformer inverter. Moreover, since the piezoelectric transformer is driven in the λ/2 mode, the size of the piezoelectric-transformer inverter can be reduced further. In addition, the push-pull drive of the piezoelectric transformer eliminates distortion of the output waveform, elimination of which has been a theme in design of conventional λ/2-mode Rosen-type piezoelectric transformers.

BRIEF DESCRIPTION OF THE DRAWINGS

For the purpose of illustrating the invention, there is shown in the drawing a form which is presently preferred, it being understood, however, that the invention is not limited to the precise arrangement and instrumentality shown.

DESCRIPTION OF THE PREFERRED EMBODIMENT

An embodiment of the present invention will be described with reference to the drawings.

Figure 1:
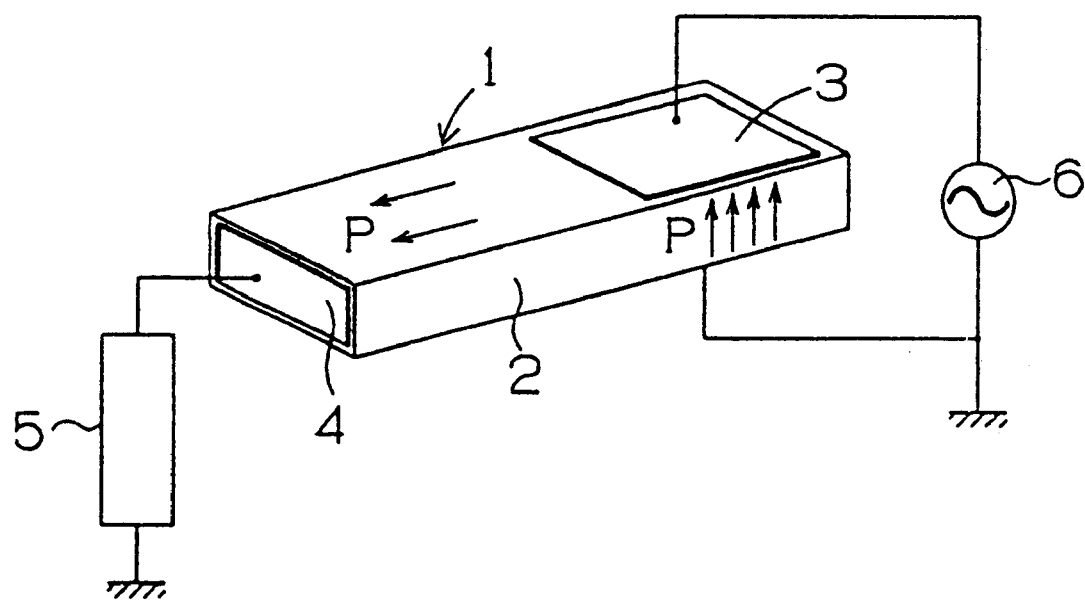
FIG. 1 is a perspective view showing a Rosen-type piezoelectric transformer.
Figure 2:
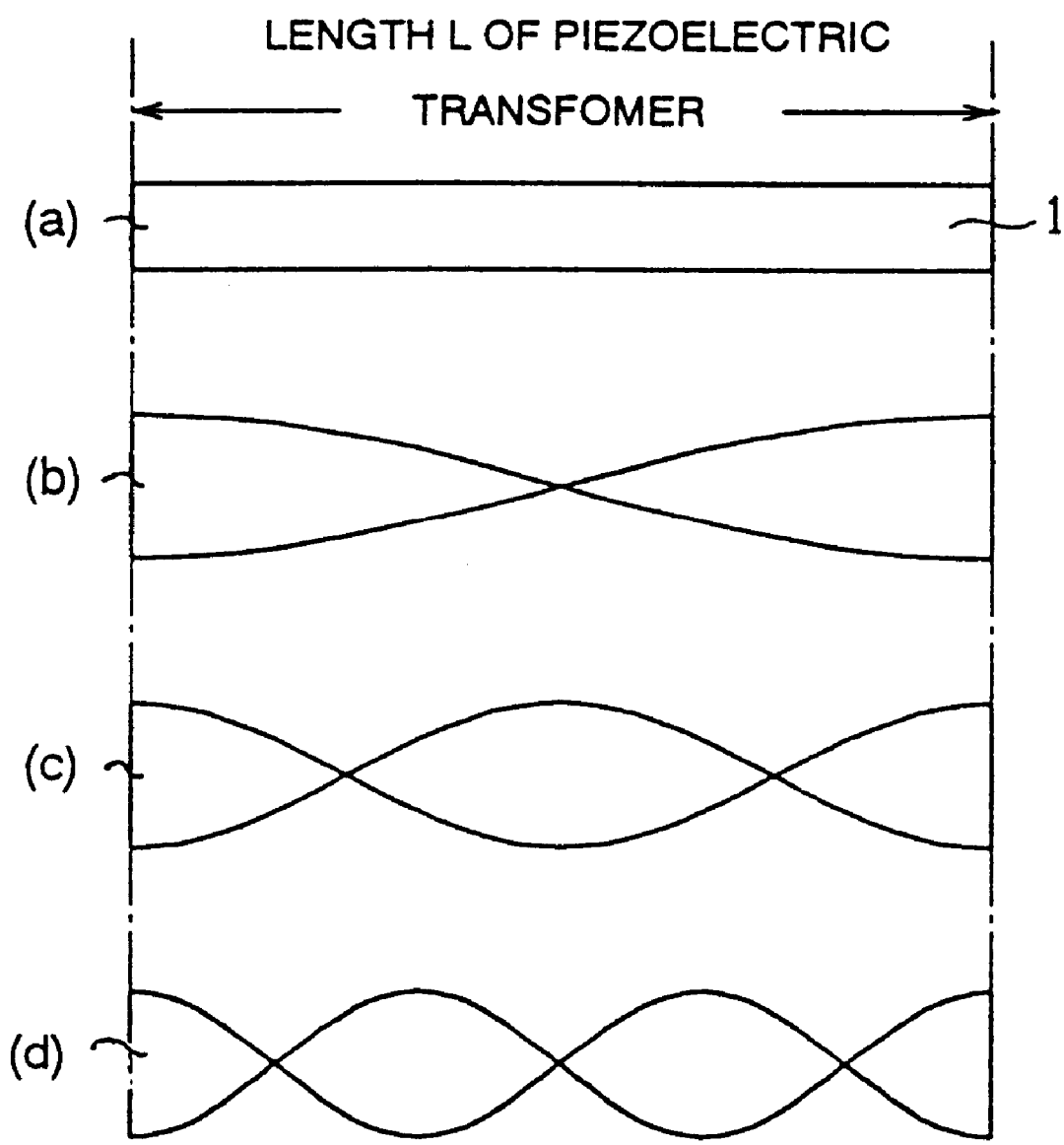
FIG. 2 is a schematic view showing a piezoelectric transformer and its vibration modes.
Figure 3:
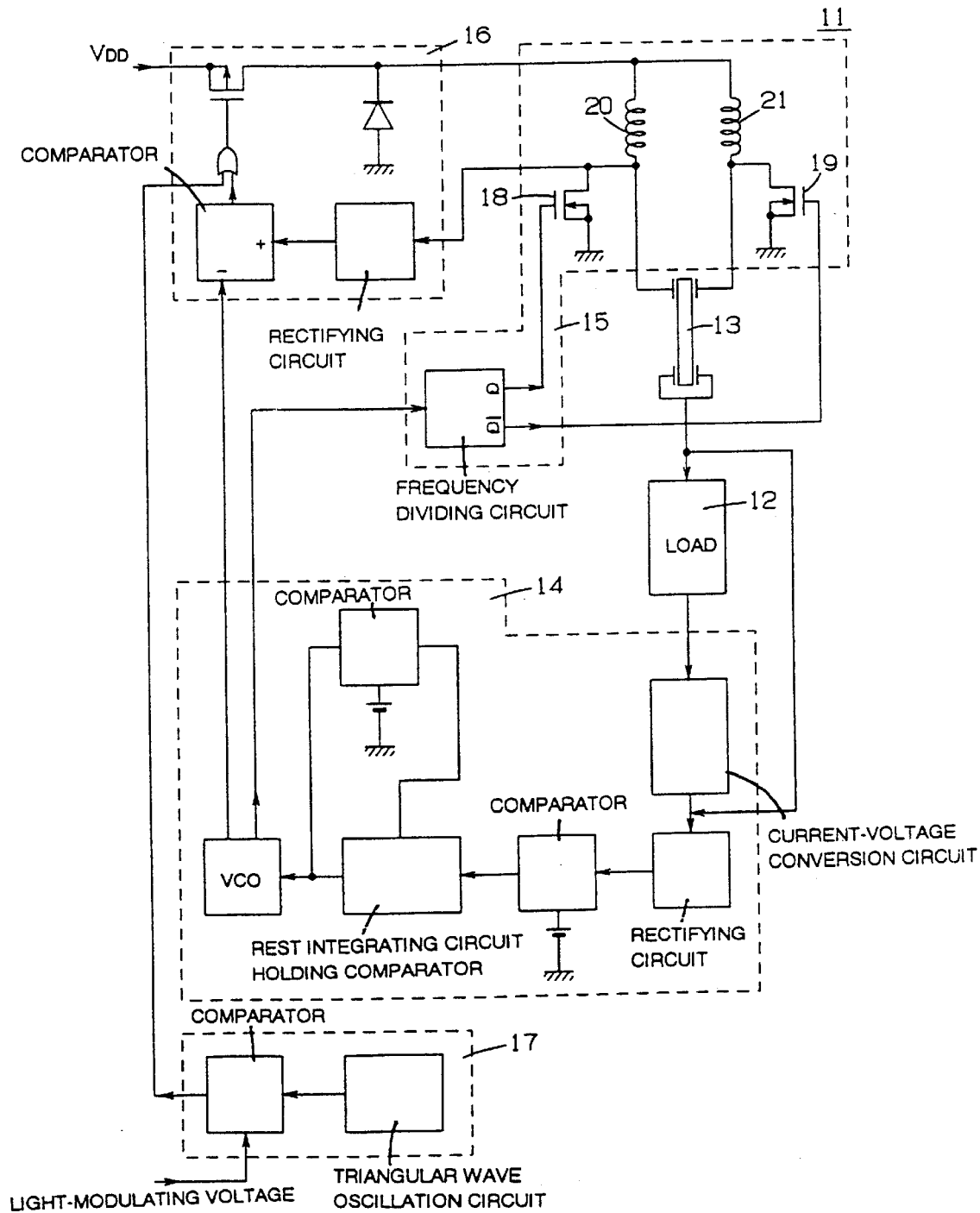
FIG. 3 is a circuit diagram showing the structure of a conventional piezoelectric-transformer inverter.
Figure 4:
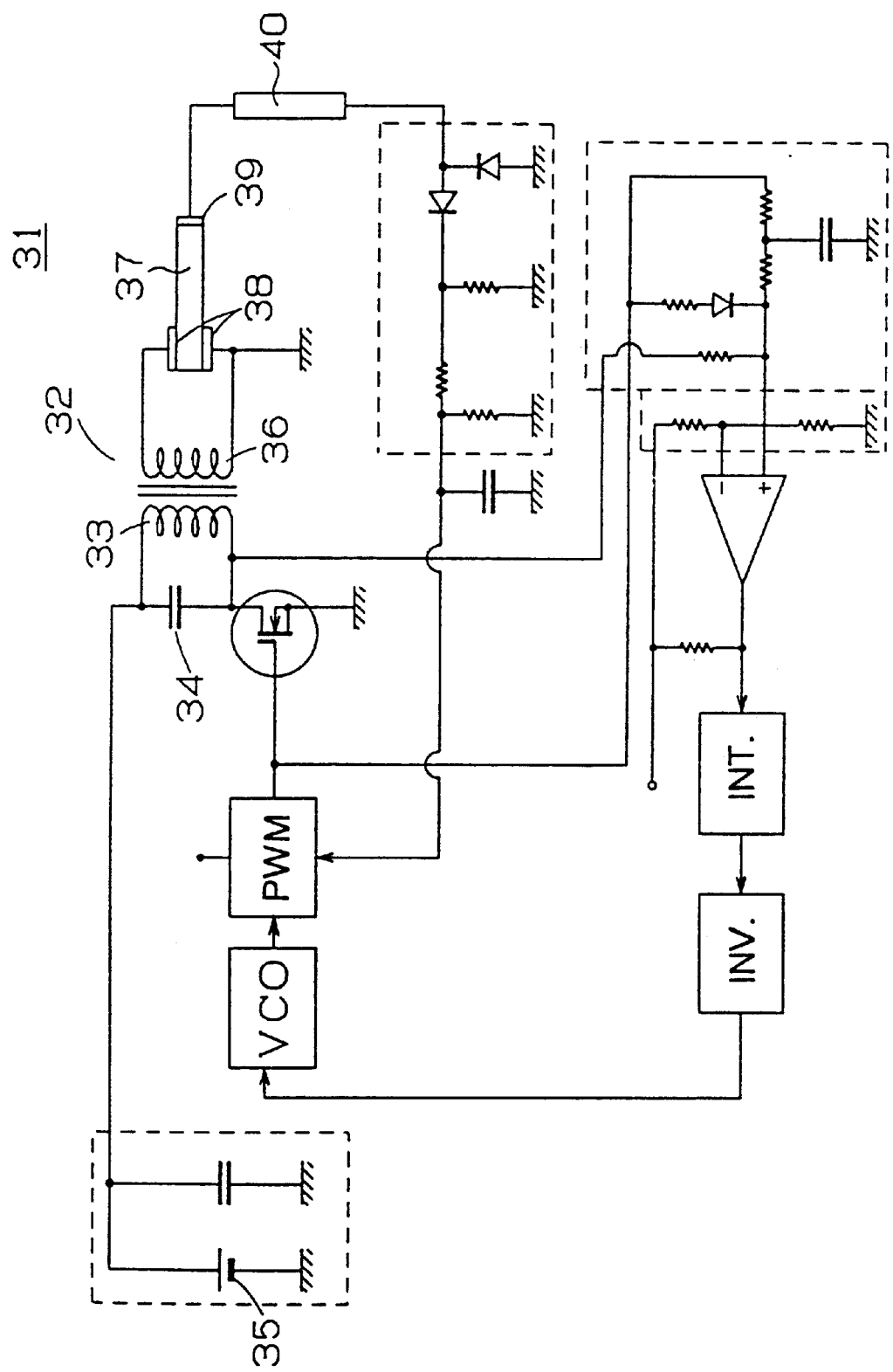
FIG. 4 is a circuit diagram showing the structure of another conventional piezoelectric-transformer inverter.
Figure 5:
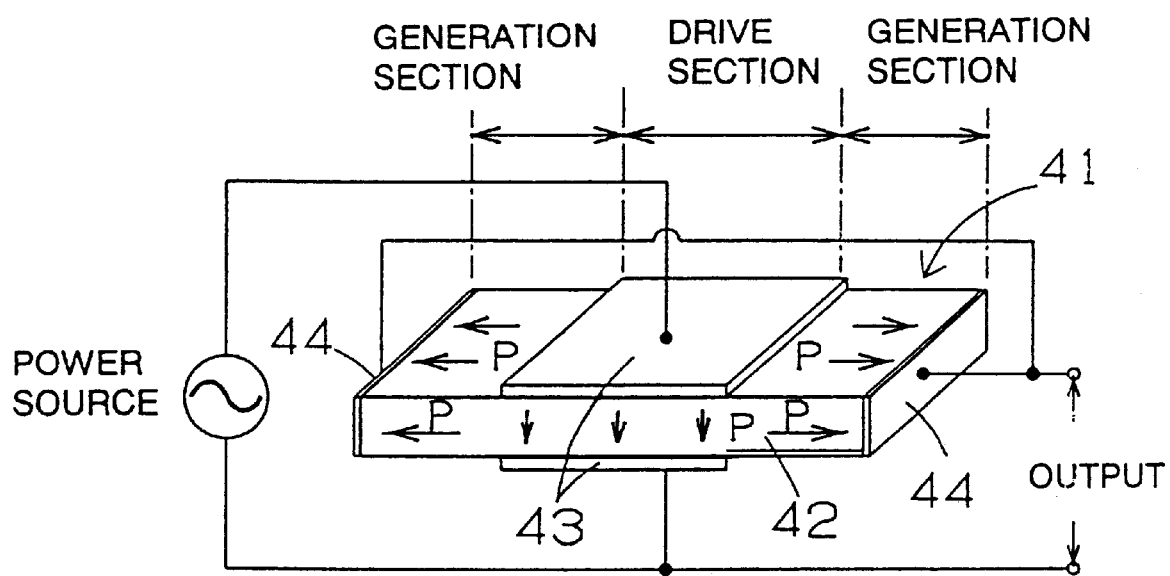
FIG. 5 is a perspective view of a center-drive-type piezoelectric transformer used in still another conventional piezoelectric-transformer inverter.
Figure 6:
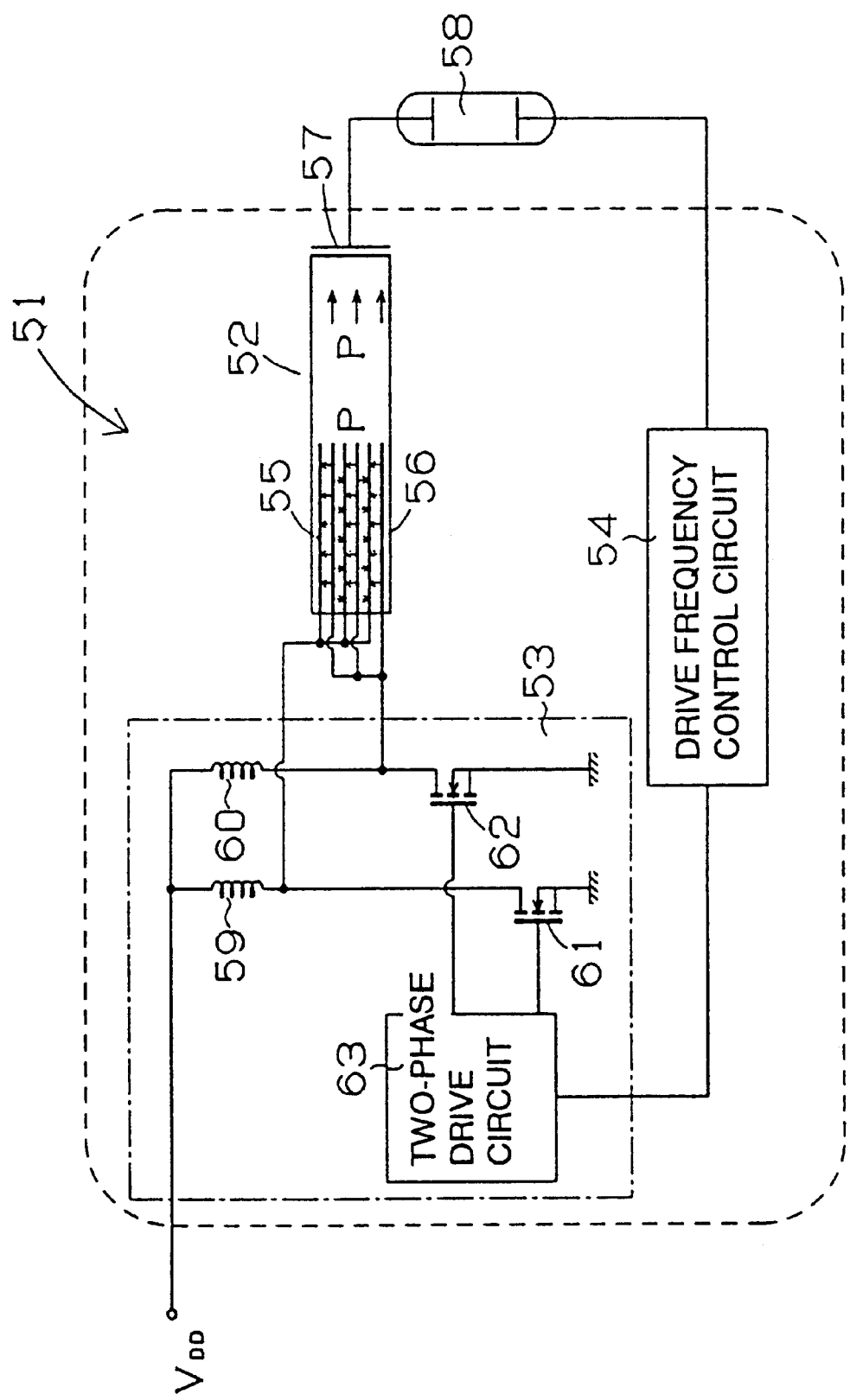
FIG. 6 is a circuit diagram showing the structure of a piezoelectric-transformer inverter according to an embodiment of the present invention.

FIG. 6 is a circuit diagram showing the structure of a piezoelectric-transformer inverter 51 according to a first embodiment of the present invention. The piezoelectric-transformer inverter 51 is composed of three circuit blocks; i.e., a piezoelectric transformer 52, a step-up circuit 53, and a drive frequency control circuit 54.

The piezoelectric transformer 52 steps up AC voltage applied between its primary electrodes 55 and 56, through utilization of the piezoelectric effect, and outputs a stepped up voltage from a secondary electrode 57 in order to supply AC current (tube current) to a fluorescent tube 58 serving as a load. Output terminals of the step-up circuit 53 are connected to the primary electrodes 55 and 56, and the second electrode 57 is connected to the fluorescent tube 58. The piezoelectric transformer 52 used in the present embodiment is a Rosen-type piezoelectric transformer having a layered structure (such a transformer will occasionally be referred to herein as a "Rosen-type layered piezoelectric transformer").

The step-up circuit 53 applies an AC voltage of a predetermined frequency (drive frequency) to the primary electrodes 55 and 56 of the piezoelectric transformer 52 in order to drive the piezoelectric transformer 52 for step-up operation. The step-up circuit 53 is composed of two coils 59 and 60, two transistors 61 and 62, and a two-phase drive circuit 63. The coil 59 and the transistor 61 are connected in series as are the coil 60 and the transistor 62. The series circuit containing the coil 59 and the transistor 61 and the series circuit containing the coil 60 and the transistor 62 connected in parallel each other. An input power source is connected to a connection point between the coils 59 and 60. An intermediate point between the coil 59 and the transistor 61 is connected to one primary electrode 55 of the piezoelectric transformer 52, and an intermediate point between the coil 60 and the transistor 62 is connected to the other primary electrode 56 of the piezoelectric transformer 52.

Figure 7:
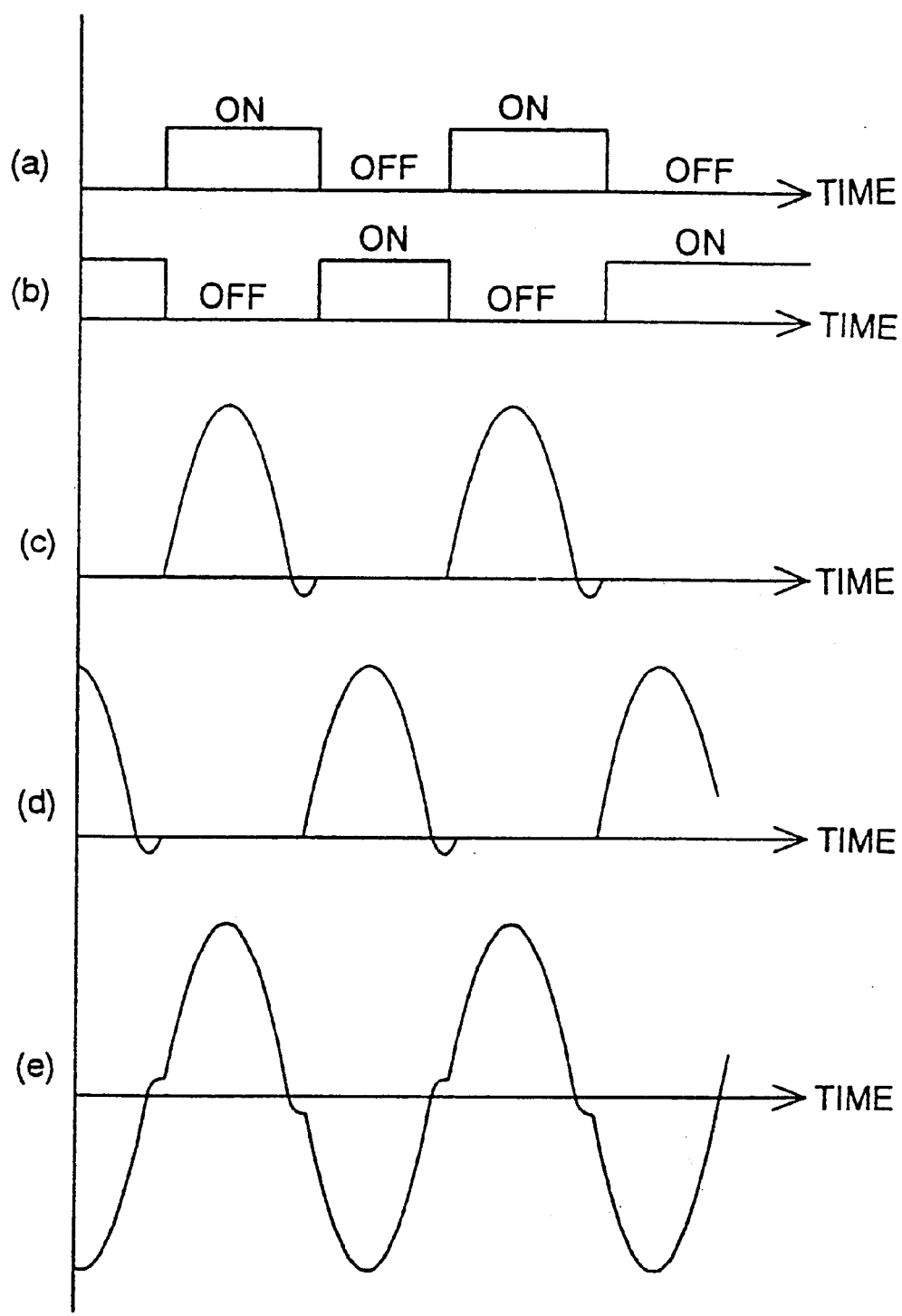
FIG. 7 is waveform charts for describing the operation of a step-up circuit used in the piezoelectric-transformer inverter.

FIG. 7 shows various waveforms in the step-up circuit 53. Waveforms (a) and (b) represent the on/off states of the transistors 62 and 61, respectively. Wave form (c) represents voltage V1 supplied from the intermediate point between the coil 59 and the transistor 61 to one primary electrode 55, whereas waveforms (d) represents voltage V2 supplied from the intermediate point between the coil 60 and the transistor 62 to the other primary electrode 56. Waveform (e) represents voltage V1–V2 applied between the primary electrodes 55 and 56 of the piezoelectric transformer 52. The two-phase drive circuit 63 alternately turns on and off the two transistors 62 and 61, as indicated by waveforms (a) and (b). Current from the input power source flows through the coil 59 or 60 connected to the transistor 61 or 62 that is turned on, so that electromagnetic energy is charged therein. When the transistor 61 or 62 is turned off, the electromagnetic energy charged in the coil 59 or 60 is discharged, so that a voltage higher than the input power source voltage $V_{DD}$ is output. Accordingly, when the two-phase drive circuit 63 alternately turns on and off the two transistors 61 and 62, as shown in waveforms (c) and (d) of FIG. 7, AC voltages (half wave) V1 and V2 having a waveform that is close to a sinusoidal waveform are applied to the primary electrodes 55 and 56 of the piezoelectric transformer 52 in alternating half-periods. As a result, as shown at waveform (e) of FIG. 7, an AC voltage (full wave) V1–V2 having substantially a sinusoidal waveform is applied between the primary electrodes 55 and 56 of the piezoelectric transformer 52.

Figure 8:
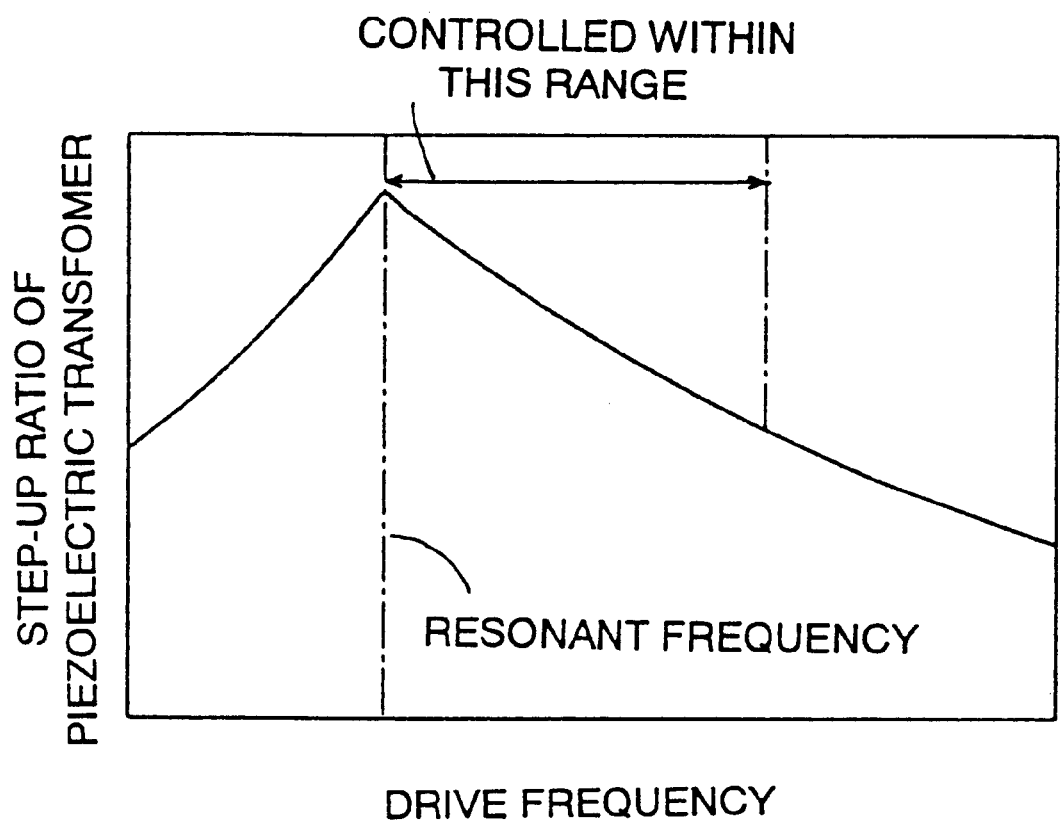
FIG. 8 is a chart showing the relationship between the step-up ratio of a piezoelectric transformer and its drive frequency.

The drive frequency control circuit 54 monitors the frequency of the AC current flowing through the fluorescent tube 58 at a predetermined value by changing its operation frequency. As shown in FIG. 8, the piezoelectric transformer 52 has a characteristic such that the step-up ratio is greatest at its resonant frequency. The drive frequency control circuit 54 operates within a frequency range higher than the resonant frequency. The drive frequency control circuit 54 detects the peak value of the load current flowing through the fluorescent tube 58, and when the peak value of the load current exceeds a predetermined value, the drive frequency control circuit 54 increases the drive frequency. When the peak value of the load current becomes lower than the predetermined value, the drive frequency control circuit 54 decreases the drive frequency. In this manner, the two transistors 61 and 62 of the step-up circuit 53 are driven alternately at a frequency controlled by the drive frequency control circuit 54, so that the frequency of the drive voltage V1–V2 applied between the primary electrodes 55 and 56 of the piezoelectric transformer 52 is controlled in order to maintain the peak value of the load current constant.

Figure 9A:
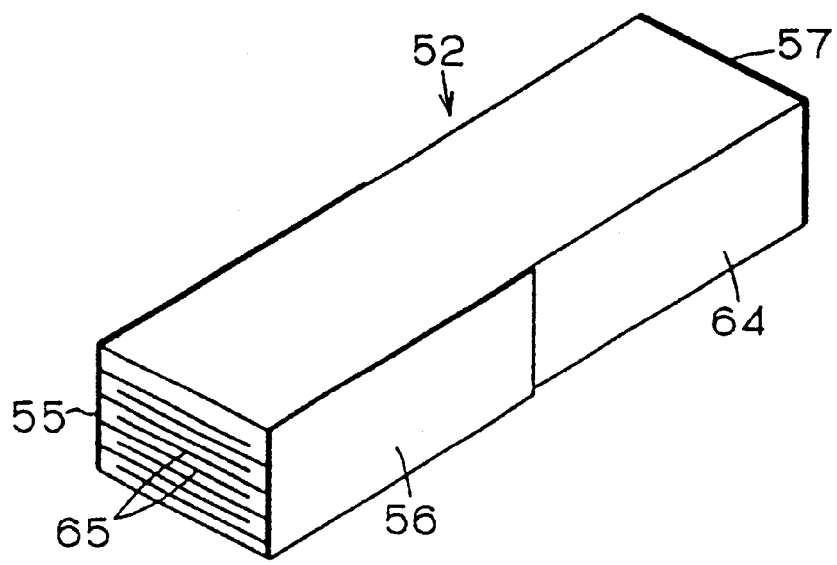
FIG. 9A is a perspective view of a piezoelectric transformer used in the piezoelectric-transformer inverter.
Figure 9B:
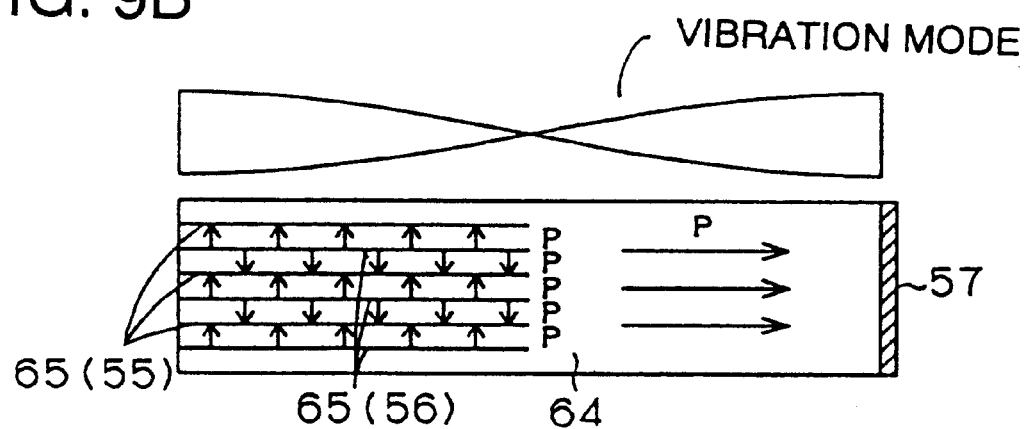
FIG. 9B is a view showing a cross section of the piezoelectric transformer and its vibration mode.

The Rosen-type layered piezoelectric transformer 52 will be described with reference to FIGS. 9A and 9B. The piezoelectric transformer 52 has a structure in which a plurality of piezoelectric ceramic layers are superposed and united to from a piezoelectric substrate 64, and in one half of the piezoelectric substrate 64, a plurality of electrode films 65 are sandwiched between the piezoelectric ceramic layers of the piezoelectric substrate 64. Alternate electrode films 65 are electrically connected together to form one primary electrode 55, and the remaining electrode films 65 are electrically connected together to form the other primary electrode 56. In the region where the primary electrodes 55 and 56 of the piezoelectric transformer 52 are formed, the piezoelectric substrate 64 is polarized in the thicknesswise direction thereof by means of any suitable polarization process. In addition, alternate piezoelectric ceramic layers between the respective electrode films 65 are polarized in opposite directions. Arrows P in FIG. 9B show the directions of polarization in the respective regions in the piezoelectric substrate 64. Further, a secondary electrode 57 is formed on the end surface on a side opposite the region where the primary electrodes of the piezoelectric transformer 52 are formed. In the half portion where the second electrode 57 is formed, the piezoelectric substrate 64 is polarized in the longitudinal direction thereof by means of a polarization process.

In the above-described piezoelectric transformer 52, since the opposite end surfaces are open ended, the fundamental vibration mode of the piezoelectric transformer 52 becomes the λ/2 mode, which is depicted in FIG. 9B. Also, since the primary electrodes 55 and 56 of the piezoelectric transformer 52 have a layered structure, the step-up ratio of the piezoelectric transformer 52 can be increased as compared to a piezoelectric transformer having a single layer structure. Accordingly, in the piezoelectric-transformer inverter 51, through use of the Rosen-type piezoelectric transformer 52, the dead space of the piezoelectric-transformer inverter 51 can be decreased in order to reduce the size of the piezoelectric-transformer inverter 51. In addition, the layered structure of the piezoelectric transformer 52 increases the step-up ratio of the piezoelectric transformer 52, so that an output voltage greater than the input power source voltage $V_{DD}$ can be output from the piezoelectric transformer 52. Moreover, since the λ/2-mode piezoelectric transformer 52 whose size can be easily decreased is driven through push-pull operation, there can be eliminated distortion of the output waveform, elimination of which has been a theme in design of the conventional λ/2-mode Rosen-type piezoelectric transformer. Next, the above-described features of the present invention will be described with reference to actual measurement data.

Figure 10:
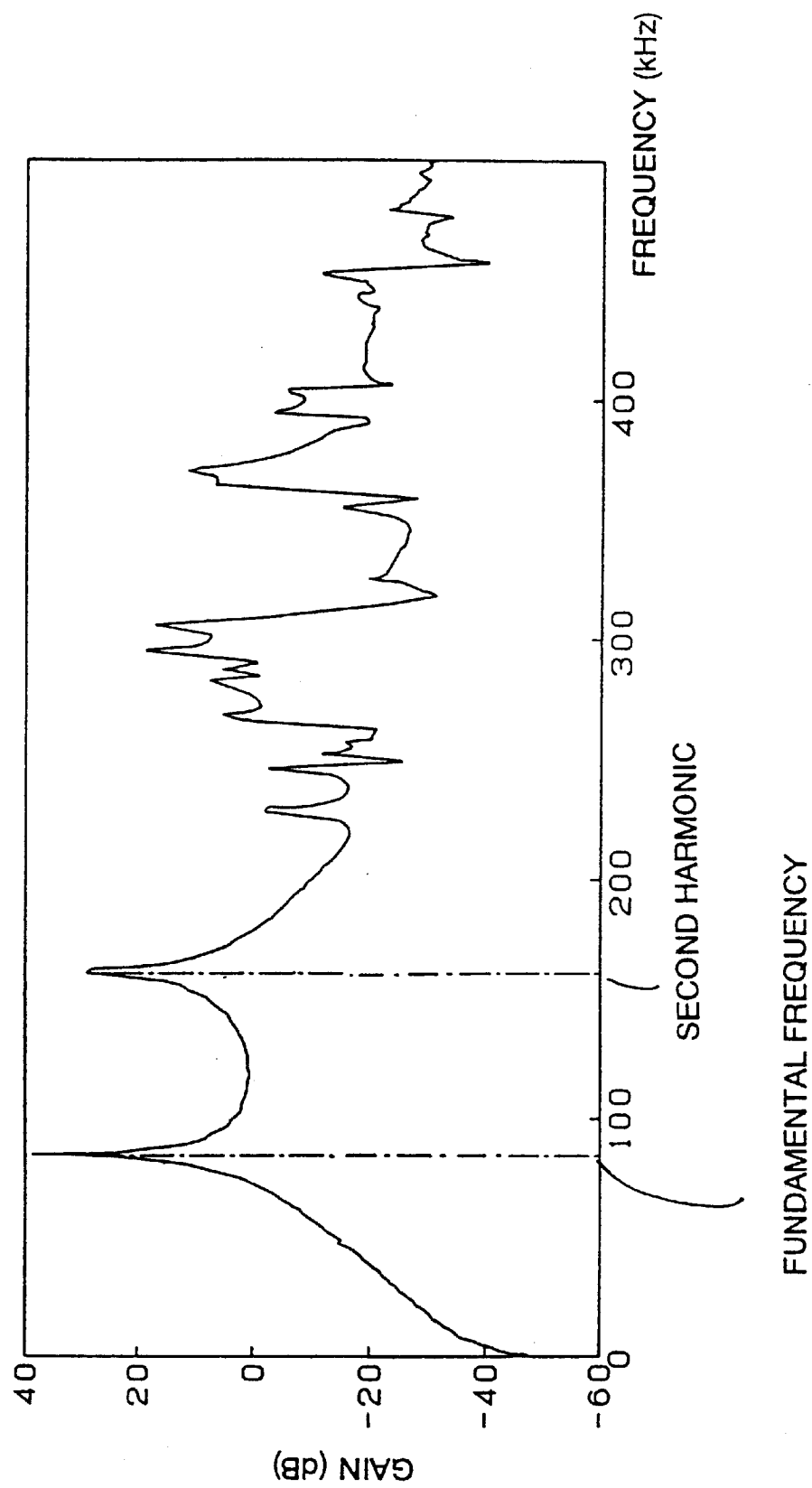
FIG. 10 is a graph showing the frequency-gain characteristic of a λ/2-mode Rosen-type layered piezoelectric transformer.

FIG. 10 shows the frequency-gain characteristic of the λ/2-mode Rosen-type layered piezoelectric transformer 52. According to this characteristic, a step-up ratio of about 40 dB (=100 times) is obtained at a frequency in the vicinity of the fundamental frequency 83 kHz. Further, the coils 59 and 60 of the step-up circuit 53 and the input capacitance of the piezoelectric transformers 52 resonate to step up an input voltage by a factor of about three. Therefore, the above-described two step-up operations realize a desired step-up ratio (300 times). Therefore, without use of an electromagnetic transformer 32 of relatively large size, the fluorescent tube 58 can be driven by use of the input power-source voltage of a single lithium-ion cell. As shown in FIG. 10, a relatively high gain peak appears at a frequency of the second harmonic (frequency of the λ mode).

Figure 11:
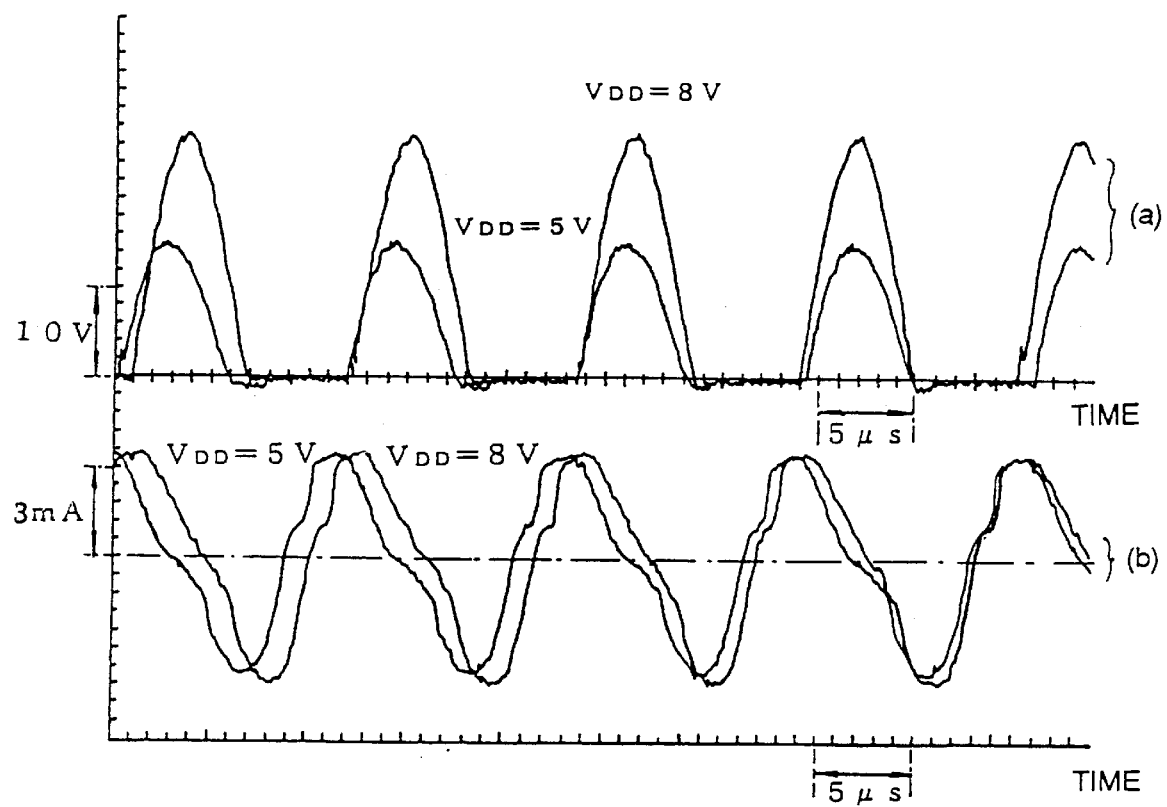
FIG. 11 is a chart showing resonant waveforms (voltages input to the primary electrodes of the piezoelectric transformer) and the waveform of the output current for the case where the Rosen-type layered piezoelectric transformer is driven in a single-end-drive piezoelectric-transformer inverter.

FIG. 11 show resonant waveforms (voltages input to the primary electrodes 55 and 56 of the piezoelectric transformer 52) and the waveform of the output current for the case where the above-described Rosen-type layered piezoelectric transformer 52 is driven in the single-end-drive piezoelectric-transformer inverter 51 disclosed in Japanese Patent Application Laid-Open No. 9-56175 described in the Related Art section. The output current waveform is asymmetric with respect to the horizontal axis, which indicates that harmonics are superimposed on the output voltage and output current. When the input voltage is changed from 5 V to 8 V, the negative peak of the output current (load current) increases although the positive peak of the output current is controlled at a constant level. In other words, if the output voltage of the piezoelectric transformer 52 contains harmonic components, the waveform of the load current becomes distorted, even if the positive peak of the load current is maintained constant, so that the root-mean-square value of the load current cannot be controlled at a constant level.

Figure 12:
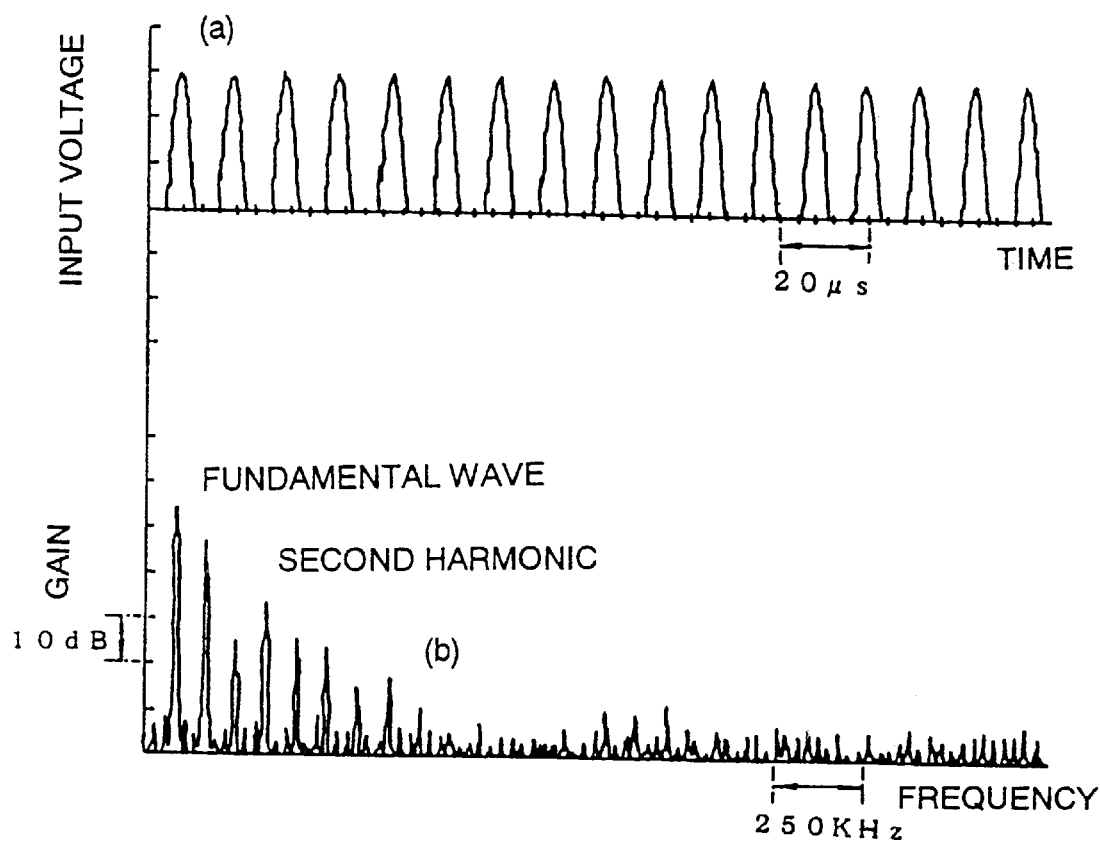
FIG. 12 is a chart showing the waveform of an input voltage and results of a frequency analysis for the case where the Rosen-type layered piezoelectric transformer is driven in the single-end-drive piezoelectric-transformer inverter.

FIG. 12 represents the waveform of a voltage input to the Rosen-type layered piezoelectric transformer 52 and results of a frequency analysis for the case where the Rosen-type layered piezoelectric transformer 52 is driven in the single-end-drive piezoelectric-transformer inverter 51. As can be seen from these drawings, in the single-end drive scheme, the input voltage contains harmonic components whose frequencies are n times the frequency of the fundamental wave, where n is an integer. Therefore, the second harmonic of the fundamental wave is amplified at a gain corresponding to the second peak gain (corresponding to the λ vibration mode) of the waveform (b), so that harmonic components are superposed on the output voltage.

Figure 13:
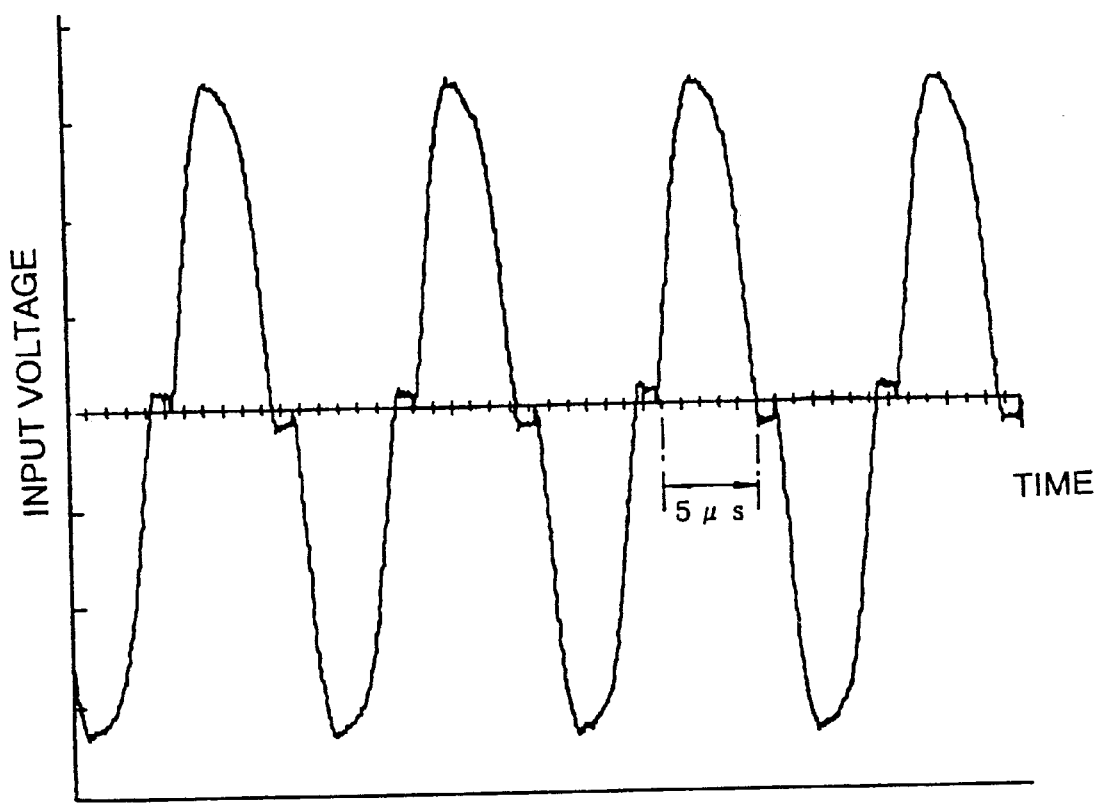
FIG. 13 is a chart showing the waveform of an input voltage for the case where the Rosen-type layered piezoelectric transformer is driven by a push-pull drive scheme.
Figure 14:
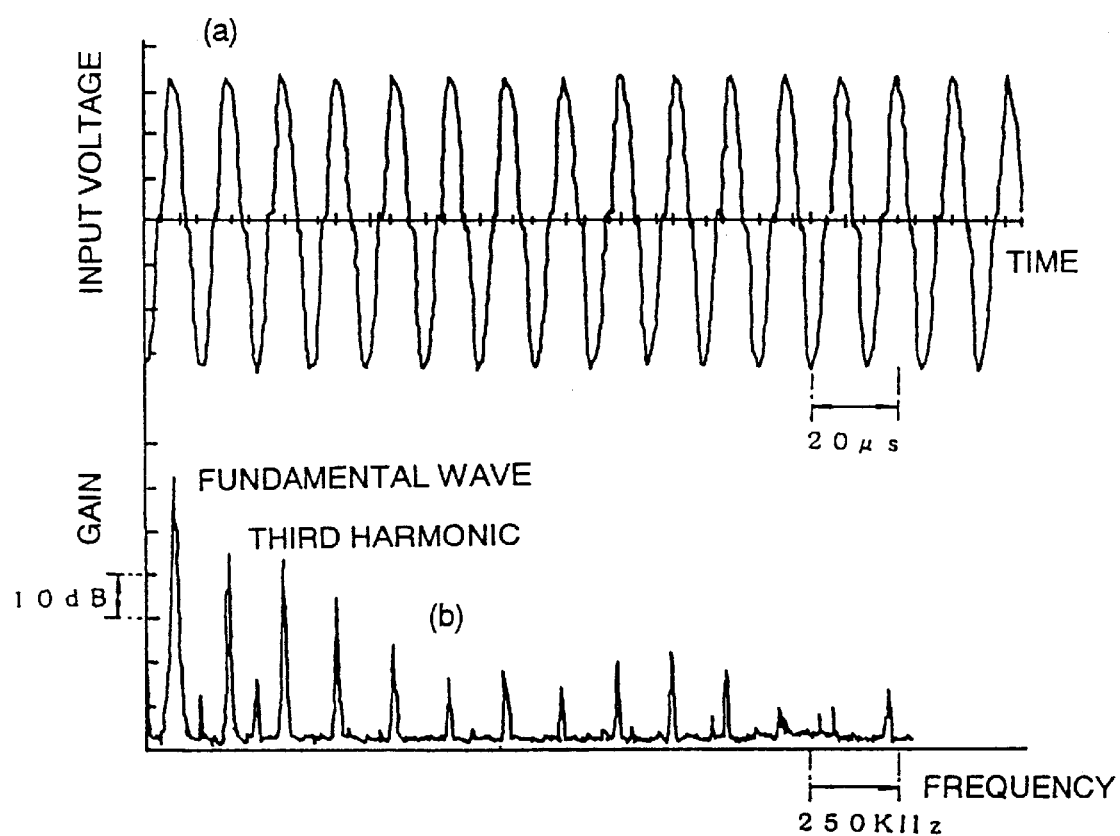
FIG. 14 is a chart showing results of a frequency analysis for the case where the Rosen-type layered piezoelectric transformer is driven in a push-pull-drive piezoelectric-transformer inverter.

FIG. 13 shows the waveform of a voltage input to the Rosen-type layered piezoelectric transformer 52 for the case where the Rosen-type layered piezoelectric transformer 52 is driven by a push-pull drive scheme as in the present invention. FIG. 14 show results of a frequency analysis for this case. As can be seen from FIG. 14, when the piezoelectric transformer 52 is driven by the push-pull drive scheme, the voltage input to the transformer 52 hardly contains even harmonics. Further, as shown in FIG. 10, in the case of the λ/2-mode Rosen-type layered piezoelectric transformer 52, the third harmonic and higher odd harmonics have no large step-up (gain) peaks. Consequently, the output voltage and the output current hardly contain harmonic components.

When the output voltage and the output current do not contain harmonic components, the root-mean-square value of the load current can be maintained constant through the control used to maintain the peak value of the load current constant. Therefore, constant power can be supplied to the fluorescent tube even when the input voltage fluctuates.

In the present invention, the piezoelectric-transformer inverter 51 in which the peak value of load current is detected, and frequency control is performed in order to maintain the peak value constant is constructed such that the piezoelectric transformer 52 has a layered structure and is driven by a push-pull scheme. This enables employment of the coils 59 and 60 whose sizes can be easily reduced. The employment of the above-described structure allows the fluorescent tube 58 to be lighted through use of a low voltage power source such as a single lithium-ion cell.

Further, since the push-pull drive decreases even harmonics contained in the voltage input to the piezoelectric transformer 52, there can be employed the λ/2-mode Rosen-type piezoelectric transformer 52, which has been difficult to use for piezoelectric-transformer inverters due to the problem of waveform distortion caused by the second harmonic. Since the size of the λ/2-mode Rosen-type piezoelectric transformer 52 is half that of conventionally used λ-mode piezoelectric transformers, more-compact piezoelectric inverters can be realized. Further, when the piezoelectric transformer 52 of the present invention is compared with a center-drive type piezoelectric transformer which also has an effect of reducing waveform distortion as in the present invention, the piezoelectric transformer 52 of the present invention has an advantage that since only one longitudinal end assumes a high voltage, there can be reduced the size of the dead space where other components cannot be mounted.

The present invention may be embodied in other specific forms without departing from the spirit or essential attributes thereof and, accordingly, reference should be made to the appended claims, rather than to the foregoing specification, as indicating the scope of the invention.

What is claimed is:

1. A piezoelectric-transformer inverter comprising:

a piezoelectric transformer operating to transform an AC voltage applied between its primary electrodes to a transformed voltage supplied to a load connected to its secondary electrode, said piezoelectric transformer comprising:

a piezoelectric substrate having a first region which is polarized in a first direction and a second region which is polarized in a second direction different than said first direction;

a plurality of electrode films layered in said first region and connected together into first and second groups to form said first and second primary electrodes; and an electrode formed on an end surface of said piezoelectric substrate located substantially adjacent said second region to form said secondary electrode;

a first coil and a first switching element connected to said first primary electrode of said piezoelectric transformer;

a second coil and a second switching element connected to said second primary electrode of said piezoelectric transformer;

a drive circuit which alternately drives said first and second switching elements such that the phase of the voltage applied between said primary electrodes is reversed cyclically; and drive frequency control circuit which controls an AC current flowing through said load at a predetermined value by changing the operation frequency of said drive circuit;

said piezoelectric transformer operating in a half wavelength mode.

2. A piezoelectric-transformer inverter according to claim 1, wherein said piezoelectric transformer is a Rosen-type piezoelectric-transformer in which said primary electrodes have a layered structure.

3. A piezoelectric-transformer inverter according to claim 1, wherein said first region covers about one half of said piezoelectric substrate and said second region covers about the other half of said piezoelectric substrate.

4. A piezoelectric-transformer inverter according to claim 1, wherein said switching elements are transistors.

5. A piezoelectric-transformer inverter according to claim 1, wherein said first and second directions are thickness and longitudinal directions of said piezoelectric substrate, respectively, and wherein a length of said second region of said piezoelectric substrate as measured along said longitudinal direction is equal to one-half a wavelength which corresponds to a vibrating frequency of said piezoelectric-transformer in said longitudinal direction.

* * * * *